(12) United States Patent
Wu

(10) Patent No.: US 6,825,073 B1
(45) Date of Patent: Nov. 30, 2004

(54) SCHOTTKY DIODE WITH HIGH FIELD BREAKDOWN AND LOW REVERSE LEAKAGE CURRENT

(75) Inventor: Shye-Lin Wu, Hsinchu Hsien (TW)

(73) Assignee: Chip Integration Tech Co., Ltd., Hsin-Chu (TW)

(*) Notice: Subject to any disclaimer, the term of this patent is extended or adjusted under 35 U.S.C. 154(b) by 0 days.

(21) Appl. No.: 10/663,666

(22) Filed: Sep. 17, 2003

(51) Int. Cl.[7] ............. H01L 21/338; H01L 21/44; H01L 21/20
(52) U.S. Cl. ............. 438/167; 438/575; 438/576; 438/580; 438/583
(58) Field of Search ............. 438/161–173, 438/570–583

(56) References Cited

U.S. PATENT DOCUMENTS

| | | | | |
|---|---|---|---|---|
| 5,109,256 A | * | 4/1992 | De Long | 257/476 |
| 5,163,179 A | * | 11/1992 | Pellegrini | 257/451 |
| 5,888,891 A | * | 3/1999 | Gould | 438/575 |
| 6,184,564 B1 | * | 2/2001 | Gould | 257/486 |
| 6,211,560 B1 | * | 4/2001 | Jimenez et al. | 257/451 |
| 6,225,653 B1 | * | 5/2001 | Igel et al. | 257/280 |
| 6,624,030 B2 | * | 9/2003 | Chang et al. | 438/268 |
| 6,727,525 B1 | * | 4/2004 | Goerlach | 257/107 |
| 6,765,264 B1 | * | 7/2004 | Chang et al. | 257/336 |
| 2003/0096464 A1 | * | 5/2003 | Lanois | 438/173 |
| 2004/0110330 A1 | * | 6/2004 | Collard | 438/167 |

* cited by examiner

Primary Examiner—Cuong Nguyen
(74) Attorney, Agent, or Firm—Troxell Law Office PLLC

(57) ABSTRACT

A Schottky diode structure and a method of making the same are disclosed. The method comprises following steps: firstly, a semiconductor substrate having a first conductive layer and an epi-layer doped with the same type impurities is provided. Then a first oxide layer is form on the epi layer. A patterning step to pattern first oxide layer and recess the epi layer (optional) is then followed to define guard rings. After stripping the photoresist pattern, a polycrystalline silicon layer formation is then followed. A boron and/or $BF_2^+$ ion implant is then performed. Subsequently, a high temperature drive in process and oxidation process to oxidize the polycrystalline silicon layer and drive ions is then carried out. A second mask and etch steps are then performed to open the active regions. A metallization process is then done. A third mask and etch steps are then implemented to define anode. Finally, a backside metal layer is then formed and serves as a cathode.

6 Claims, 6 Drawing Sheets

SCHOTTKY DIODE WITH HIGH FIELD BREAKDOWN AND LOW REVERSE LEAKAGE CURRENT

FIELD OF THE INVENTION

The present invention relates to a Schottky diode semiconductor devices, specifically, to a Schottky diode device having less leakage current and high field breakdown and a method of manufacturing the same.

BACKGROUND OF THE INVENTION

Schottky diodes are widely used as voltage rectifiers in many power switching applications, such as switching-mode power supplies, electric motor, switching of communication device, industry automation and electronic automation and so on. Though the Schottky diodes have a high speed switching characteristics, the large reverse leakage current and low breakdown voltage will limit the operation of Schottky diodes to a high reverse voltage and with a higher temperature.

It is well known that a p+ guard ring diffusion region surround the periphery of the active Schottky contact area could increase the reverse breakdown voltage (U.S. Pat. No. 3,541,403). The p+ guard ring diffusion region is formed from boron-nitride diffusion source or by boron or $BF_2^+$ ion implantation. However, the high dose boron ion implantation will induce surface damage and result in high leakage current. Also, the p-n junction curvature effect, referred to S. M. Sze: "Physics of Semiconductor Devices", $2^{nd}$, Chapter 2, will significantly affect the reverse leakage current and breakdown voltage. It needs a very long term thermal cycle at high temperature to drive in the boron dopant deep enough into silicon substrate to form a large p-n junction curvature to reduce the reverse leakage current and increase the breakdown voltage.

An object of the present invention is to propose a new method of forming a high switching speed Schottky diode with high breakdown voltage and low leakage current.

SUMMARY OF THE INVENTION

A Schottky diode structure and a method of making the same are disclosed. The method comprises following steps: firstly, an n+ semiconductor substrate having a first conductive layer and an n-epi layer is provided. Then a first oxide layer is formed on the n-epi layer. A patterning step to define guard-ring (GR) regions and the first oxide layer at this region is etched out. After stripping the photoresist, a polycrystalline silicon layer is deposited by LPCVD or APCVD. Then, the boron or $BF_2^+$ ion implantation is performed. Thereafter, a high temperature annealing process to drive in the boron ions through the polycrystalline silicon layer into the n-epi layer is carried out using the doped polycrystalline silicon layer as a diffusion source. Subsequently, an oxidation process to fully oxidize the polycrystalline silicon layer into thermal oxide and drive in the boron ions deep into silicon substrate is then performed. A second mask and etch steps are then implemented to open the active area (AA) regions. A barrier metal deposition and metal silicidation process is then done. After the top metal formation, the third mask and etch steps are then implemented to define the anode. Finally, a backside metal layer is then formed and served as a cathode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The preferred embodiment is to illustrate the method of forming termination structure and the Schottky diode simultaneously.

Figure 1A:
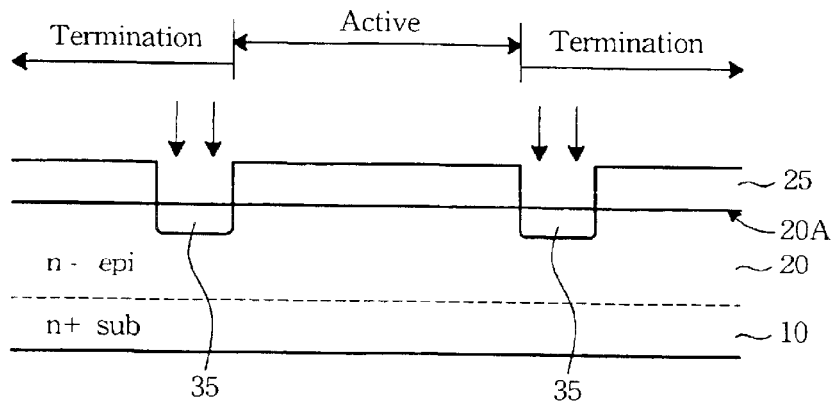
FIG. 1A to FIG. 1C show conventional processes for Schottky diode devices with p+ guard rings.
Figure 1B:
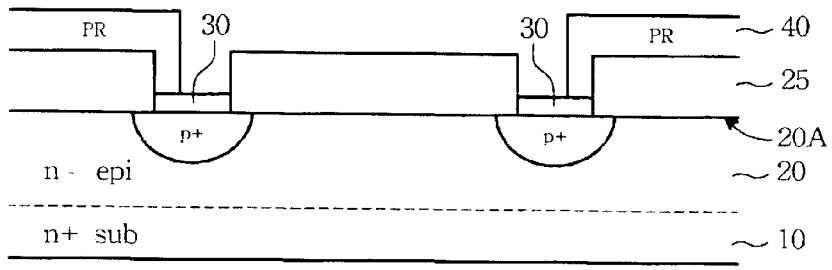
Figure 1C:
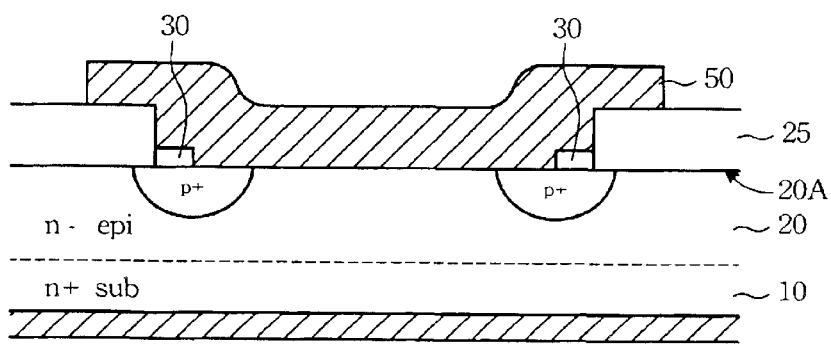
Figure 2:
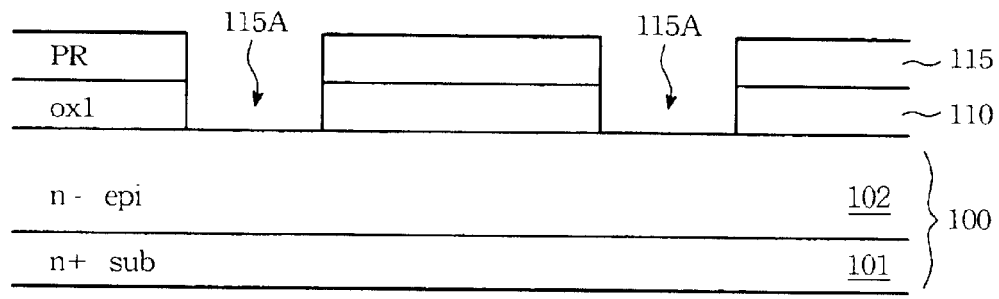
FIG. 2 is a cross-sectional view illustrating a patterning process to defined guard rings by using a first photoresist pattern in accordance with the present invention.

Referring to FIG. 2, a cross-sectional view shows a semiconductor substrate 100 having a relatively heavily doped n+ doped layer 101 and a lightly doped n-epi-layer 102 provided.

A thick oxide layer 110 between about 100 to 2000 nm is then formed on the n-epi layer 102 by a thermal oxidation process or by using CVD technique. A photoresist pattern 115 having openings 115A to define guard ring regions is then formed on the first oxide layer 110.

Still referring to FIG. 2, an etching step is then performed to etch the first oxide layer 110 by using the photoresist pattern 115 as a mask. The photoresist pattern 115 is then stripped away.

Figure 3:
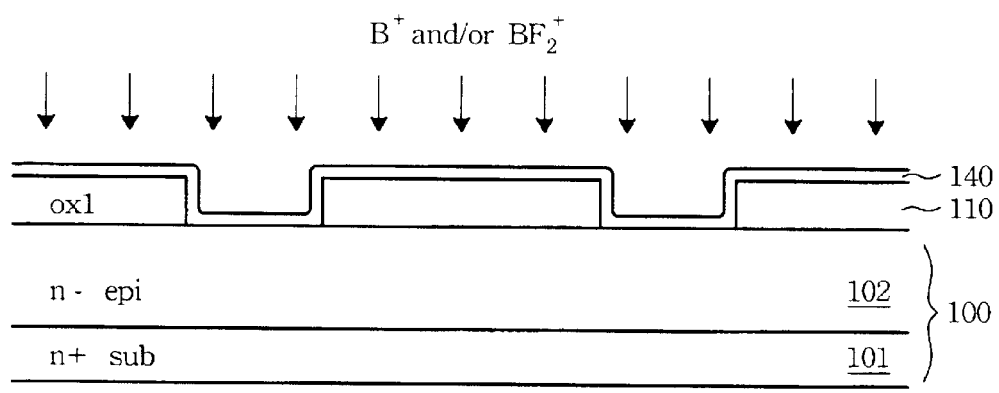
FIG. 3 is a cross-sectional view of forming a polycrystalline silicon layer on all regions and then performing blanket boron or $BF_2^+$ ion implantation in accordance with the present invention.

Afterward, referring to FIG. 3, a polycrystalline silicon layer 140 between about 20 nm to 1000 nm is then formed on all areas by using a process of low pressure chemical vapor deposition (LPCVD). A high dose $BF_2^+$ or boron ions is blanket implanted into the n-epi layer 102 by using a dosage between about 1E11 to $5E16/cm^2$ and energy between 10 to 400 KeV, respectively.

Figure 4:
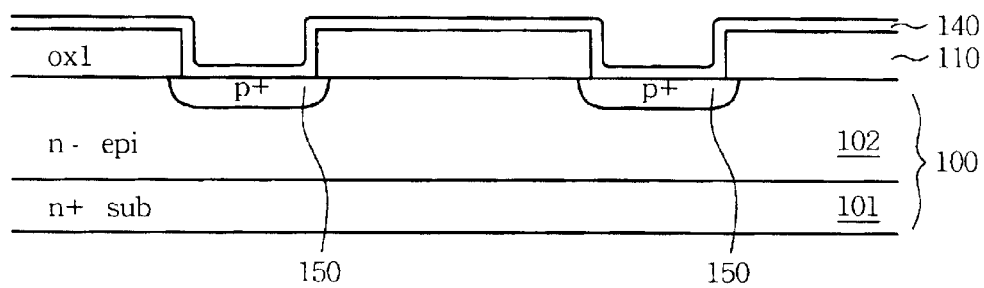
FIG. 4 is a cross-sectional view of performing an annealing process to form p+ buried region by using the doped polycrystalline silicon layer as a diffusion source in accordance with the present invention.

Referring to FIG. 4, a high temperature anneal process is then carried out to activate ions and form p+ regions 150 using the polycrystalline silicon layer 140 as a diffusion source.

Figure 5:
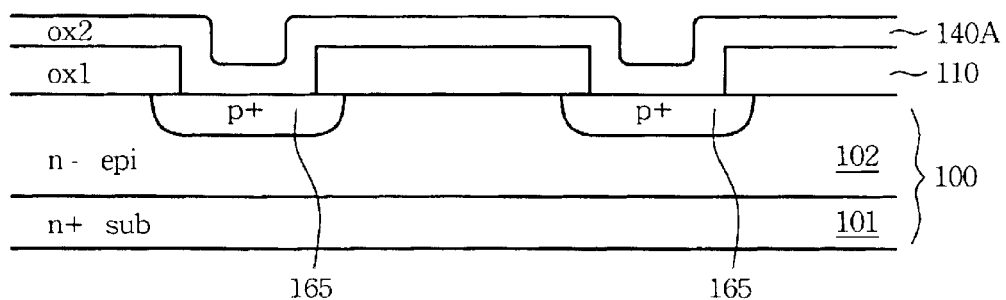
FIG. 5 is a cross-sectional view of oxidizing the polycrystalline silicon layer into thermal oxide and driving in boron ions deep into the silicon substrate in accordance with the present invention.

Referring to FIG. 5, a thermal oxidation process is then performed to grow a second oxide layer 140A by oxidizing the polycrystalline silicon layer 140. Meanwhile, the impurities are driving into the n–epi layer 102 by both lateral and longitudinal diffusion to expand buried p+ region 150 thereof. The expanded p+regions herein are also called guard rings 165.

Subsequently, please see FIG. 6, a photoresist pattern 160 having openings to expose an active region is formed. The active region includes a region from a portion of guard ring 165 at a termination region 200a to another 200b, and all guard rings 165 in between the termination region 200a and 200b, please also forward to FIG. 9.

Figure 6:
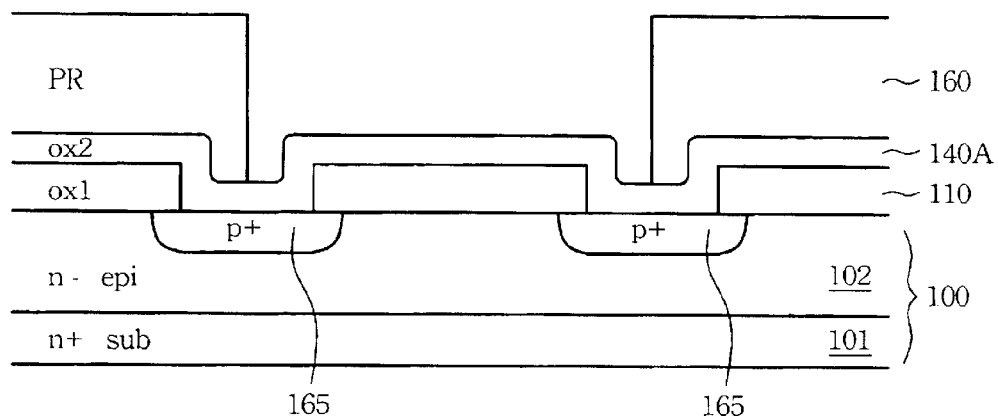
FIG. 6 is a cross-sectional view of forming a second photoresist pattern to define the active region in accordance with the present invention.

Referring to FIG. 6, a wet etch is then performed to etch the exposed all of those exposed oxide layer 110, 140A by using the photoresist pattern 160 as a mask.

Figure 7:
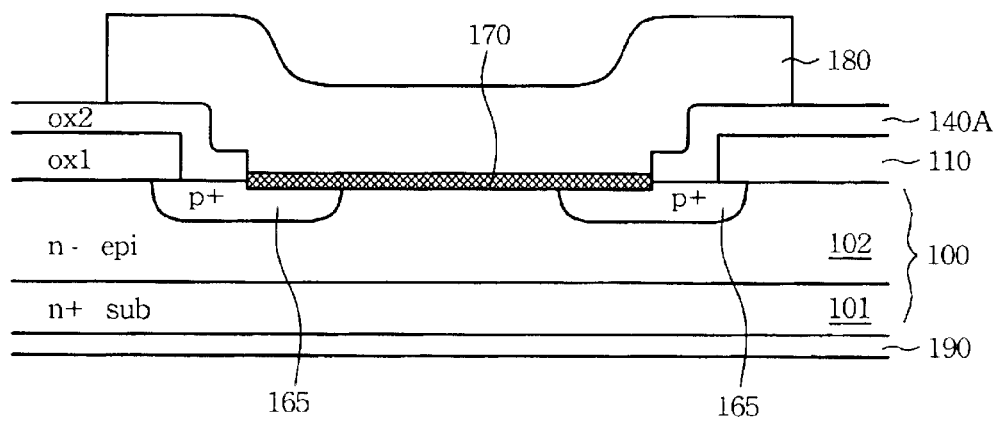
FIG. 7 is a cross-sectional view of etching those exposed oxide layers and then forming silicide layer on active region and then forming a top metal layer and then patterning the top metal layer for forming an anode electrode in accordance with the present invention.

As is shown in FIG. 7, after stripping away the photoresist pattern 160, A Schottky barrier metal layer 170 is then deposited on all areas. The material of the barrier metal for instance, includes Ti, Ni, Cr, Pd, Pt, W, Mo etc. A thermal anneal at a temperature between about 200 to 850° C. in nitrogen ambient is then done to form a silicide layer 170 on the active regions.

The unreacted metal layer on the second oxide layer 140A is then removed. Afterward, another thick top metal layer 180 is then formed on the entire areas. An exemplary candidate for the top metal layer is a Ti/Ni/Ag or Ti/Ni/Al layer, etc. Afterward, the top metal layer 180 is patterned to define anode. The resulted top metal layer 180 covers the entire active region and is extended to a portion of termination mesa region. Subsequently, a lapping process is performed firstly to remove all of the layers formed on the backside surface of the substrate 100 during aforementioned processes and then a backside metal layer 190 acted as a cathode is formed thereafter by sputtering.

Figure 8A:
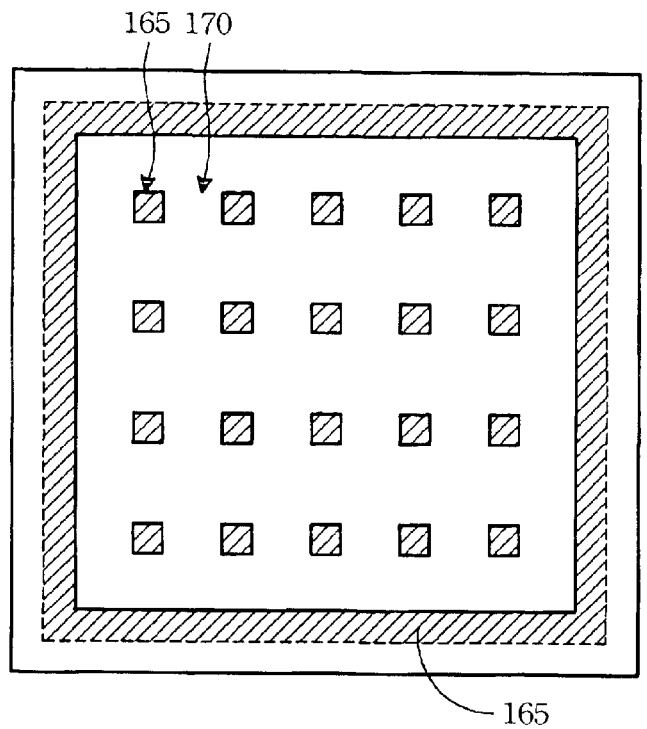
FIGS. 8A and 8B show synoptic layouts of the devices in accordance with the present invention.
Figure 8B:
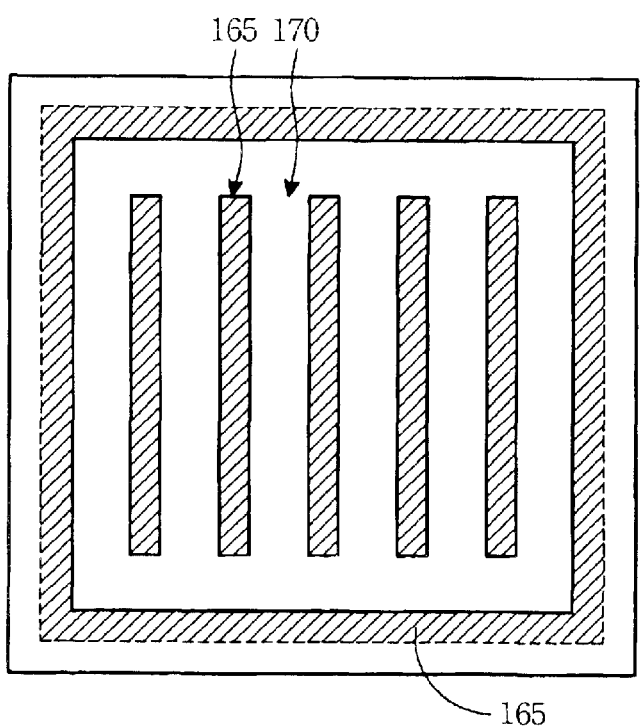

FIGS. 8A and 8B show synoptic layouts of the devices in accordance with the present invention. It shows a plurality of square guard rings 165 or rectangular guard rings 165.

Figure 9:
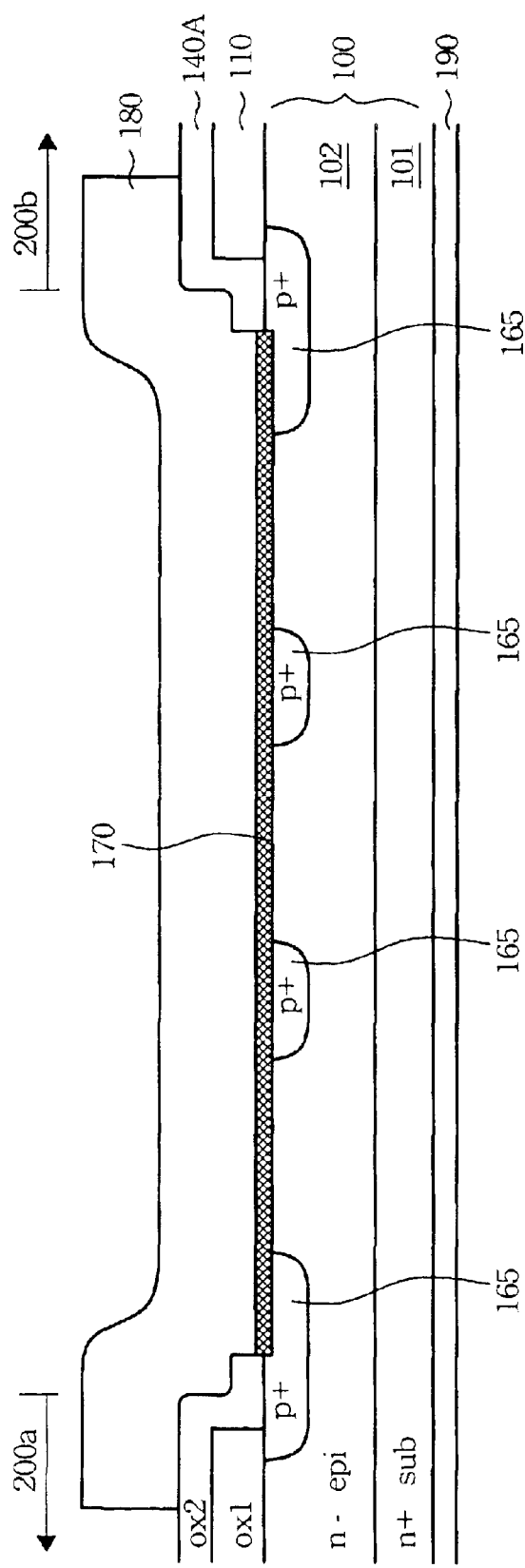
FIG. 9 is a cross-sectional view of Schottky diode structure having the plurality of guard rings at the active region and two at the termination regions according to the present invention.

FIG. 9 shows a cross-sectional view of the device having two guard rings at the active region and two at the termination regions according to the present invention.

The benefits of this invention are:

1. The guard rings p+ region at the termination region is broad and extended and thus the bending region of the depletion boundary far away from the active region than the conventional device.

2. The high dose ion implantation damages could be neglected by using the polycrystalline silicon layer as the diffusion source, by referring to the author's other patent: U.S. Pat. No. 5,347,161. Base on the above benefits, the Schottky diode with high breakdown voltage and low reverse leakage current could be obtained.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A method of forming semiconductor device, said method comprising the steps of:

providing a semiconductor substrate having a first conductive layer and an epi-layer doped with the same type impurities but is doped tightly than said first conductive layer;

forming a first oxide layer on said epi-layer;

forming a first photoresist pattern on said first oxide layer to define guard ring regions;

performing a first etching step etching said first oxide layer by using said first photoresist pattern as a mask;

stripping away said first photoresist pattern;

forming a polycrystalline silicon layer an all areas;

performing a blanket ion implant to implant p type impurities into said polycrystalline silicon layer;

performing an anneal process to form p regions using said doped polycrystalline silicon layer as an impurity souse, forming a second oxide layer by oxidizing said polycrystalline silicon layer and driving impurities doped said ion implant to expand said p regions thereby forming said guard ring regions;

forming a second photoresist pattern to exposed an active region;

etching said second oxide layer using said second photoresist pattern as a mask;

removing said second photoresist pattern;

forming a barrier metal layer on entire surfaces of said substrate;

performing a thermal anneal to form metal silicide layer by consuming silicon of said epi-layer;

removing unreacted barrier metal layer;

forming a top metal layer on entire surfaces;

patterning said top metal layer to define an anode electrode;

removing layers formed on a backside surface of said semiconductor substrate during forgoing steps; and forming a backside metal layer on said backside surface, said backside metal layer acted as a cathodes.

2. The method according to claim 1 wherein said ion implant implants $BF_2^+$ and/or boron using a dosage and energy between about 1 E11 to 5E16/$cm^2$ and 10 to 400 keV, respectively.

3. The method according to claim 1 wherein said polycrystalline silicon layer has a thickness between about 20 to 1000 nm.

4. The method according to claim 1 wherein said step of annealing process is performed at a temperature between about 200 to 850° C.

5. The method according to claim 1 wherein said barrier metal layer is made of material selected from the group consisting of Ti, Ni, Cr, Mo, Pt, Zr, W and the combination thereof and wherein said top metal layer is formed of stack layers of TiNi/Ag or Al.

6. The method according to claim 1 wherein said second photoresist pattern is partially over said guard ring regions and thus said active region is at a region between two guard ring regions and includes a portion of them.

* * * * *